United States Patent
Choi et al.

(10) Patent No.: US 8,748,968 B2
(45) Date of Patent: Jun. 10, 2014

(54) METHOD OF FORMING NANO DOTS, METHOD OF FABRICATING THE MEMORY DEVICE INCLUDING THE SAME, CHARGE TRAP LAYER INCLUDING THE NANO DOTS AND MEMORY DEVICE INCLUDING THE SAME

(75) Inventors: Jae-young Choi, Suwon-si (KR); Hyeon-jin Shin, Suwon-si (KR); Seon-mi Yoon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1077 days.

(21) Appl. No.: 12/081,357

(22) Filed: Apr. 15, 2008

(65) Prior Publication Data

US 2009/0101964 A1    Apr. 23, 2009

(30) Foreign Application Priority Data

Oct. 17, 2007 (KR) .................. 10-2007-0104734

(51) Int. Cl.
   *H01L 21/336* (2006.01)
(52) U.S. Cl.
   USPC ............ 257/324; 257/E21.423; 257/E29.309; 977/774; 977/943
(58) Field of Classification Search
   USPC ............ 257/314–322, 324, 325, E21.423, 257/E29.309
   See application file for complete search history.

(56) References Cited

U.S. PATENT DOCUMENTS

| 6,528,181 | B1 | 3/2003 | Yamane et al. | |
| 2003/0183504 | A1* | 10/2003 | Ajayan et al. | 204/157.15 |
| 2005/0008562 | A1* | 1/2005 | Hyeon et al. | 423/448 |
| 2005/0237834 | A1* | 10/2005 | Bozano et al. | 365/203 |
| 2007/0014151 | A1* | 1/2007 | Zhang et al. | 365/185.01 |
| 2007/0104892 | A1* | 5/2007 | Ishida et al. | 427/577 |
| 2008/0150010 | A1* | 6/2008 | Lee et al. | 257/325 |
| 2008/0191256 | A1* | 8/2008 | Bidan et al. | 257/298 |

(Continued)

FOREIGN PATENT DOCUMENTS

| JP | 2002-029719 A | 1/2002 |
| JP | 2002-231834 A | 8/2002 |

(Continued)

OTHER PUBLICATIONS

Nagatsu et al. J. Carbon vol. 44, pp. 3336-3341, Jun. 2006, Narrow multi-walled carbon nanotubes produced by chemical vapor deposition using graphene layer encapsulated catalytic metal particles.*

(Continued)

*Primary Examiner* — Mamadou Diallo
(74) *Attorney, Agent, or Firm* — Harness, Dickey & Pierce, P.L.C.

(57) ABSTRACT

Provided are a method of forming nano dots, method of fabricating a memory device including the same, charge trap layer including the nano dots and memory device including the same. The method of forming the nano dots may include forming cores, coating surfaces of the cores with a polymer, and forming graphene layers covering the surfaces of the cores by thermally treating the cores coated with the polymer. Also, the cores may be removed after forming the graphene layers. In addition, the surfaces of the cores may be coated with a graphitization catalyst material before coating the cores with the polymer. Also, the cores may include metal particles that trap charges and may also function as a graphitization catalyst.

8 Claims, 9 Drawing Sheets

(56) References Cited

U.S. PATENT DOCUMENTS

| | | | |
|---|---|---|---|
| 2009/0078581 A1* | 3/2009 | Nair et al. | 205/440 |
| 2009/0230461 A1* | 9/2009 | Lee | 257/325 |
| 2010/0173478 A1* | 7/2010 | Tombler | 438/478 |

FOREIGN PATENT DOCUMENTS

| | | |
|---|---|---|
| JP | 2004-307334 A | 11/2004 |
| JP | 2004-307334 A | 11/2004 |
| JP | 2007-046074 A | 2/2007 |
| KR | 20030071352 A | 9/2003 |
| KR | 20040025569 A | 3/2004 |
| KR | 20070051839 A | 5/2007 |
| WO | WO-2006/059368 A1 | 6/2006 |
| WO | WO 2007015010 A1 * | 2/2007 |

OTHER PUBLICATIONS

Athanassiou et al. Sensors and Actuators A. 138 (Apr. 2007), pp. 120-129, Insulator coated metal nanoparticles with a core/shell geometry exhibit a temperature sensitivity similar to advanced spinels.*

Japanese Office Action issued Jul. 23, 2013 in Application No. JP 2008-262228, with partial English translation.

C. Kane, "Erasing electron mass," *Nature*, vol. 438, pp. 168-169 (Nov. 10, 2005).

K. Noveselov, et al., "Two-dimensional gas of massless Dirac fermions in graphene," *Nature* (Letters), vol. 438, pp. 197-200 (Nov. 10, 2005).

Y. Zhang, et al., "Experimental observation of the quantum Hall effect and Berry's phase in grapheme," *Nature* (Letters); vol. 438, pp. 201-204 (Nov. 10, 2005).

K. Novoselov, et al., "Unconventional quantum Hall effect and Berry's phase of $2\pi$ in bilayer graphene," Manchester Centre for Mesoscience and Nanotechnology, Manchester UK.

C. Berger, et al., "Electronic Confinement and Coherence in Patterned Epitaxial Graphene," Science, vol. 312, pp. 1191-1196 (May 26, 2006).

S. Stankovich, et al., "Graphene-based composite materials," *Nature* (Letters), vol. 442, pp. 282-286 (Jul. 20, 2006).

T. Ohta, et al., "Controlling the Electronic Structure of Bilayer Graphene," *Science*, vol. 313, pp. 951-954 (Aug. 18, 2006).

K. Chang, "Thin Carbon Is In: Graphene Steals Nanotubes' Allure," *The New York Times*, Apr. 10, 2007.

K. Novoselov, et al., "Electric Field Effect in Atomically Thin Carbon Films," *Science*, vol. 306, pp. 666-669 (Oct. 22, 2004).

"Radical fabric is one atom thick," BBC News (http://news.bbc.co.uk/go/pr/fr/-/2/hi/science/nature/3944651.stm), published Oct. 22, 2004.

B. Dumé, "Electrons lose their mass in carbon sheets," *NatureWeb* (Nov. 9, 2005).

J. Toon, "Carbon-Based Electronics: Researchers Develop Foundation for Circuitry and Deviced Based on Graphite," *Georgia Tech Research News* (Mar. 14, 2006).

Korean Office Action dated Jan. 9, 2014, issued in Korean Application No. 10-2007-0104734, with English translation.

Japanese Office Action dated Jan. 14, 2014, issued in Japanese Application No. 2008-262228, with English trantlation (excerpt).

* cited by examiner

METHOD OF FORMING NANO DOTS, METHOD OF FABRICATING THE MEMORY DEVICE INCLUDING THE SAME, CHARGE TRAP LAYER INCLUDING THE NANO DOTS AND MEMORY DEVICE INCLUDING THE SAME

PRIORITY STATEMENT

This application claims priority under U.S.C. §119 to Korean Patent Application No. 10-2007-0104734, filed on Oct. 17, 2007, in the Korean Intellectual Property Office (KIPO), the entire contents of which are incorporated herein by reference.

BACKGROUND

1. Field

Example embodiments relate to a semiconductor memory device and a method of fabricating the same. Other example embodiments relate to a method of forming nano dots, method of fabricating a memory device including the same, charge trap layer including the nano dots and memory device including the same.

2. Description of Related Art

As semiconductor technology develops, a method of fabricating memory devices also developed. Volatile or non-volatile memory devices may both be used to store data. However, volatile memory devices, e.g., dynamic random access memories (DRAMs), may lose the stored data when a supply of electric power is stopped. Thus, the volatile memory devices may be used where a relatively large amount of data is stored rather than storing the data for a relatively long time and a more rapid operating speed may be required.

Non-volatile memory devices may store the data for a relatively long time even when the supply of the electric power may be stopped. During the storage of the data for a relatively long time, the data may not be damaged or deformed. The data may be maintained as initially stored in the non-volatile memory devices. Therefore, the non-volatile memory devices may ensure a retention property that may maintain the stored data as initially stored. In addition to the retention property, if a rapid operating speed may be ensured, integrity of the non-volatile memory devices may be increased, and an operating voltage may be reduced.

Such non-volatile memory devices also have the advantages of the volatile memory devices, and thus, may be understood to be a combination of the conventional volatile memory devices and non-volatile memory devices. However, such non-volatile memory devices have not been commercialized, and research and investment has been done to develop these non-volatile memory devices.

Accordingly, non-volatile memory devices having some of the advantages of the volatile memory devices, for example, silicon-oxide-nitride-oxide-silicon (SONOS) memory devices, are being commercialized. Such SONOS memory devices may include a trap layer for trapping electric charges in a gate-stacked structure of a transistor. The gate-stacked structure of the transistor may further include a tunneling layer, a gate electrode, and a blocking layer. The data may be recorded by trapping the electric charges in the trap layer. When a degree of trapping the electric charges may be controlled, multi-bit data may be recorded, and thus, the SONOS memory devices may have a similar integrity as that of DRAM. In the SONOS memory devices, a nitride layer may be used as the trap layer, however, nano dots may also be used as the trap layer.

SUMMARY

Example embodiments provide a method of forming nano dots, which may prevent or reduce a memory characteristic of nano dots from degrading due to a post thermal treatment performed on the nano dots once the nano dots are formed. Other example embodiments provide a method of fabricating a memory device including the same, charge trap layer including the nano dots and memory device including the same.

Example embodiments provide a method of forming nano dots including forming cores, coating surfaces of the cores with a polymer, and forming graphene layers covering the surfaces of the cores by thermally treating the cores coated with the polymer.

The cores may be removed after forming the graphene layers. The surfaces of the cores may be coated with a graphitization catalyst material before coating the cores with the polymer. The cores may include metal particles to trap charges and function as a graphitization catalyst, or may include metal particles to trap charges. Coating the cores using the polymer may include agitating water with components of the cores, forming a solution including the cores coated with the polymer by mixing and agitating a solution obtained by agitating the water and a solution obtained by mixing water with the polymer, obtaining the cores coated with the polymer by removing the water from the solution including the cores coated with the polymer, and removing the water remaining on the polymer covering the surfaces of the cores. The thermal treatment of cores may be performed under an inert atmosphere or a reducing atmosphere. The graphene layer may be formed to have a multi-layered structure. The cores may be formed on a substrate, and the polymer may be formed on the substrate.

According to example embodiments, a method of fabricating a non-volatile memory device may include forming a tunneling layer on a substrate, forming a charge trap layer on the tunneling layer, wherein forming the charge trap layer includes forming nano dots according to example embodiments, and the nano dots each include a trap site, and covering the charge trap layer with a blocking layer.

Forming the charge trap layer may include forming cores on the tunneling layer, coating the cores with graphene layers, and removing the cores. Forming the charge trap layer may include forming cores on the tunneling layer, wherein the cores include a metal, forming a polymer covering the cores on the tunneling layer, and thermally treating the substrate so that the polymer formed on the tunneling layer is removable. Forming cores on the tunneling layer may further include coating the cores with a graphitization catalyst material. Forming the nano dots may include forming the nano dots in a multi-layered structure. The method may further include forming a gate electrode on the blocking layer, forming a mask on the gate electrode to define a gate area, etching around a peripheral portion of the mask until the substrate is exposed, removing the mask, and forming a source and a drain in the substrate.

According to example embodiments, a charge trap layer may include nano dots including graphene layers. The nano dots may be filled with a metal to trap charges. The nano dots may function as a graphitization catalyst. The metal may be one selected from the group consisting of Ni, Co, Fe, Pt, Au, Al, Cr, Cu, Mg, Mn, Mo, Rh, Si, Ta, Ti, W, U, V, and Zr. The nano dots may have a multi-layered structure.

According to example embodiments, a non-volatile memory device may include a substrate including a first impurity region and a second impurity region located a distance apart from each other, a tunneling layer on the substrate such that the tunneling layer is between the first and second impurity regions, the charge trap layer of example embodiments on the tunneling layer, wherein the nano dots each have a trap site, a blocking layer covering the charge trap layer, and a gate electrode on the blocking layer.

BRIEF DESCRIPTION OF THE DRAWINGS

Example embodiments will be more clearly understood from the following detailed description taken in conjunction with the accompanying drawings.

FIG. 1 is diagram illustrating a method of forming nano dots according to example embodiments;

FIG. 2 is a scanning electron microscope (SEM) photograph showing Ni powder used in a first example for forming the nano dots;

FIG. 3 is an SEM photograph showing Ni powder coated with a graphene layer or graphene shell in the first example for forming the nano dots;

FIG. 4 is a transmission electron microscope (TEM) photograph showing a surface layer of the Ni powder coated with the graphene layer as shown in FIG. 3;

FIG. 5 is a TEM photograph showing a remaining graphene layer or graphene shell after removing Ni from the Ni powder coated with the graphene layer formed in the first example;

FIG. 6 is a graph showing thermal contraction properties of the Ni particle coated with the graphene layer and the Ni particle that is not coated with the graphene layer, according to example embodiments;

FIG. 7 is a cross-sectional view of a semiconductor memory device according to example embodiments;

FIG. 8 is a cross-sectional view showing a charge trap layer of the semiconductor memory device, as shown in FIG. 7, the charge trap layer may include the graphene layer or graphene shell formed as a hollow sphere;

FIGS. 9-15 are cross-sectional views illustrating a method of fabricating the semiconductor memory device of FIG. 7 or 8, according to example embodiments;

FIG. 16 is a diagram showing a polymer that may be regularly arranged on a surface of a graphitization catalyst in a direction perpendicular to the surface of the graphitization catalyst, according to example embodiments; and FIG. 17 is a diagram showing a graphene layer formed of metal nano-particles to trap charges and not function as the graphitization catalyst, according to example embodiments.

Figure 1:
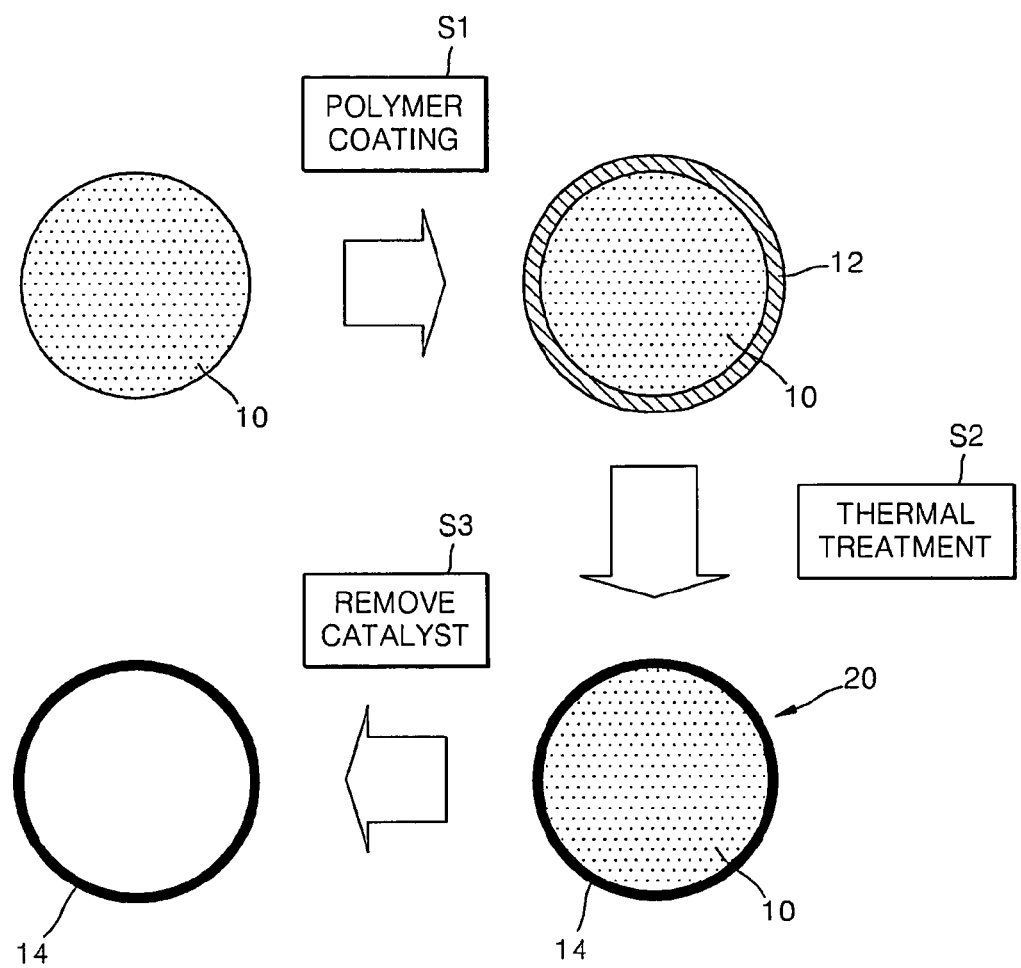
FIGS. 1-17 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments will now be described more fully with reference to the accompanying drawings. In the drawings, the thicknesses of layers and regions may be exaggerated for clarity.

FIG. 1 is diagram illustrating the method of forming nano dots according to example embodiments. Referring to FIG. 1, a metal nano dot 10 may be prepared. The metal nano dot 10 may have a work function that may perform a charge trap operation. The metal nano dot 10 may be formed of one selected from the group consisting of Ni, Co, Fe, Pt, Au, Al, Cr, Cu, Mg, Mn, Mo, Rh, Si, Ta, Ti, W, U, V, and Zr. The metal nano dot 10 may function as a graphitization catalyst, which will be described later. After preparing the metal nano dot 10, a polymer coating process may be performed on the metal nano dot 10 (S1). A polymer 12 may be coated on a surface of the metal nano dot 10. The polymer 12 may be, for example, oleyl acid, steric acid, or nonanoic acid. The metal nano dot 10, on which the polymer 12 is applied, may be thermally treated under an inert atmosphere or a reducing atmosphere (S2). The thermal treatment may be performed within a temperature range of about 400° C. to about 700° C. Through the thermal treatment of the process S2, the polymer 12 may be thermally decomposed by a graphitization catalyst, and thus, the surface of the metal nano dot 10 may be covered by a graphene layer 14 (or graphene shell). Thus, a nano dot 20 covered with the graphene layer 14 may be formed.

Although the metal nano dot 10 may function as the graphitization catalyst, an additional coating layer may also be used to function as the graphitization catalyst. For example, the metal nano dot 10 may be formed of a material that is not related to the graphitization catalyst, and then, a material layer (not shown), which may be used as the graphitization catalyst, may be coated on the surface of the metal nano dot 10. In addition, the material layer may be coated with the polymer 12, and the thermal treatment of the process S2 may be performed. A resultant obtained after performing the thermal treatment may be the same as the above example.

The material layer that may be used as the graphitization catalyst of the polymer 12 may be a catalyst that is used to compound graphite, induce a carbonization reaction, or fabricate a carbon nano-tube (CNT). For example, the catalyst may be one selected from the group consisting of Ni, Co, Fe, Pt, Au, Al, Cr, Cu, Mg, Mn, Mo, Rh, Si, Ta, Ti, W, U, V, and Zr. Therefore, where the metal nano dot 10 may be formed of the above catalyst metal, the material layer, which is used as the graphitization catalyst, may not be required. The catalyst metal may be used independently like the metal nano dot 10, however, may be deposited or coupled to a part of a substrate or a supporter. When the metal component of the nano dot 20, coated with the graphene layer 14, is melted using an acid, the graphene layer 14 may become a nano dot graphene shell which has an empty core (S3). The nano dot 20 or the nano dot graphene shell may be used as a trap layer in a charge trap memory device.

When the metal nano dot 10 is used without forming the graphene layer 14, a material such as Pd, Au, or Ir having an increased thermal resistance may be used as the metal nano dot 10. However, small metal particles having a diameter of about 1 nm to about 10 nm may be used in order to increase the integrity of the memory device. Where the small particles are used, the metal particles may be adhered to each other in a post high-temperature process, and the size of the metal particles may be increased.

For example, in order to fabricate a semiconductor memory device including the metal nano dots 10, the metal nano dots 10 may be formed on a tunneling layer, and then, a blocking layer and a gate electrode may be sequentially stacked thereon. However, where the blocking layer or the gate electrode is stacked at an increased temperature or where an annealing process after forming the metal nano dots 10 is performed at an increased temperature, the metal nano dots 10 may be diffused and may not maintain the original size of the metal nano dots 10. Accordingly, the metal nano dots 10 may be adhered to each other and may lose the function thereof. In addition, the semiconductor memory device may maintain the reliability for a relatively long time under high temperature conditions, however, if the metal nano dots 10 are used only, the metal nano dots 10 may be degraded under high temperature conditions.

The graphene may be thermally stable and may have a thermal resistance that is higher than that of the material forming the metal nano dot 10. In addition, the graphene may prevent or reduce the metal component from diffusing. Therefore, as shown in FIG. 1, where the nano dot 20, coated with the graphene layer 14, is used as the trap layer in the memory device, the cohesion of the nano dots 20 during the post high temperature process after forming the trap layer may be prevented or reduced. In addition, even when the semiconductor memory device is exposed to the relatively high temperature condition for a relatively long time, the reliability of the semiconductor memory device may be maintained. For example, the reliability of the semiconductor memory device with respect to the increased temperature may be maintained. Also, the graphene may have a work function of about 4.66 eV, which is included in a range of work functions of Ni, Co, Fe, Pt, Au, Al, Cr, Cu, Mg, Mn, Mo, Rh, Si, Ta, Ti, W, U, V, and Zr, which are materials for forming the metal nano dot 10. Therefore, the graphene may trap the charges like the metal nano dot 10, as well as may prevent or reduce the metal component from diffusing.

Therefore, the graphene may be used as the trap unit that traps the electric charges with the metal nano dot 10 in the operations of the memory device, in addition to the diffusion protection unit that may prevent or reduce the metal component from diffusing in the increased temperature process. When only the graphene layer 14 is used, the graphene may be used as the trap unit. The graphene may be formed as a single layer or multi-layers. An experimental example where the nano dots 20 are coated with the graphene layer 14 will be described as follows.

Experimental Example 1

1. About 20 Kg of Ni particles, each having a diameter of about 300 μm, was input into about 120 kg of water, and then, the water was agitated for about one hour at about 400 rpm.
2. A solution, which was made by mixing about 1 kg of oleic acid into about 46.7 kg of water, was input into the first agitated solution, and then, the mixed solution was agitated for about five hours at about 400 rpm.
3. After the second agitation, a Ni powder solution, on which a polymer was coated, was input into a filter paper under vacuum atmosphere to remove the water from the Ni powder solution. Then, Ni powder coated with the polymer was obtained.
4. The obtained Ni powder was heated for about twelve hours at a temperature of about 60° C. under a vacuum atmosphere to remove water remaining on surfaces of the coated Ni powder.
5. After the drying process, the Ni powder coated with the polymer was thermally treated at a temperature of about 500° C. under a nitrogen atmosphere to obtain the Ni powder coated with the graphene.

Figure 2:
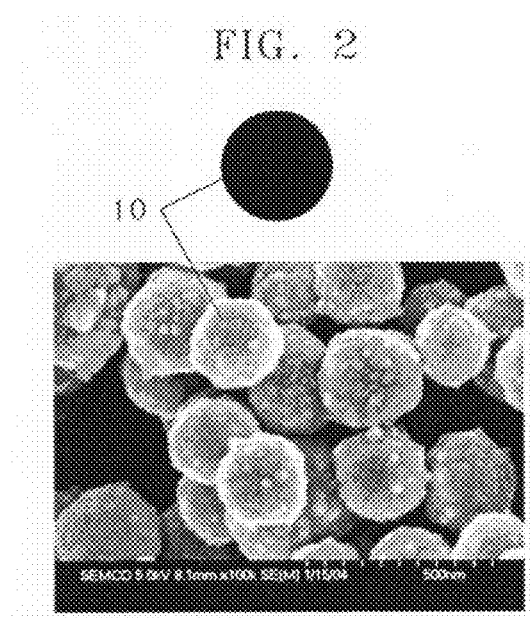
Figure 3:
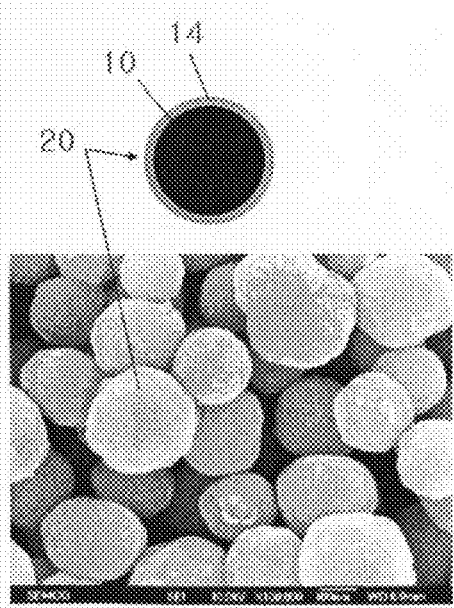

FIG. 2 shows the Ni powder that is not coated with the graphene used in the first experimental example. In FIG. 2, Ni nano dots are shown. FIG. 3 shows a surface status of the Ni powder coated with the graphene, which was obtained by thermally treating the Ni powder coated with the polymer. In FIG. 3, each of the particles is the Ni nano dot coated with the graphene.

Figure 4:
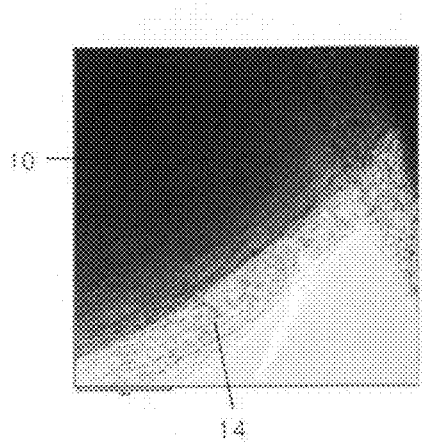

FIG. 4 is a transmission electron microscope (TEM) photograph showing the graphene layer 14 coated on the surface of each Ni nano dot in the Ni powder shown in FIG. 3. Referring to FIG. 4, the graphene layer 14 has a thickness of about 7 nm, and is formed by stacking about 20 single graphene layers.

Figure 5:
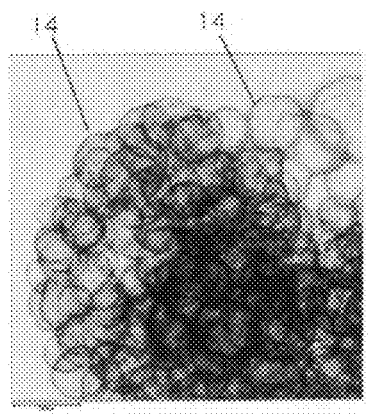

When the Ni powder coated with the graphene layer obtained in the first experimental example is soaked into an HCl solution of about 0.1 M concentration for about 24 hours, the Ni component may be melted from the inside of the graphene layer 14. Then, the graphene layer 14, which does not include the metal nano dot 10, e.g., a graphene layer or shell, is obtained. FIG. 5 shows the spherical graphene layer 14 obtained in this way.

Experimental Example 2

About 400 g of Oleic acid was used, and the other conditions were the same as those of the above experimental example. In the second experimental example, the graphene layer 14 having a thickness of about 2 nm was formed.

Experimental Example 3

About 600 g of oleic acid was used, and the other conditions were the same as those of the first experimental example. In the third experimental example, the graphene layer 14 having a thickness of about 3 nm was formed.

Experimental Example 4

About 2 kg of oleic acid was used, and the other conditions were the same as those of the first experimental example. In the fourth experimental example, the graphene layer 14 having a thickness of about 10 nm was formed.

Through the above method of forming the nano dots, the amount of the graphene layer coated on the surfaces of the nano dots may be adjusted accurately, and thus, a smaller amount or a larger amount of graphene may be coated. In addition, the coating of the graphene layer may be performed simultaneously on the entire surfaces of the nano dots, and thus, the graphene layer may be coated to a constant thickness.

Experimental Example 5

In the fifth experimental example, a thermal resistance property, e.g., a thermal shrinking property, of the Ni particles coated with the graphene layer 14 (hereinafter, first particles) obtained from the first experimental example was measured for evaluating the thermal stability of the first particle. In this example, the thermal resistance property of the Ni particles, which are not coated with the graphene layer 14, used in the first experimental example (hereinafter, second particles), was also measured for the comparison.

In order to measure the thermal shrinking properties of the first and second particles, the particles were input into a press mold and a pressure may be applied to the press mold to form a first molded body and a second molded body. The first molded body may include the first particles, and the second molded body may include the second particles. The first and second molded bodies had predetermined or given lengths (Lo) before performing the thermal treatment. The first and second molded bodies were thermally treated under the nitrogen atmosphere while increasing the temperature at a ratio of about 10° C. per minute to evaluate the shrinking caused by the heat.

Figure 6:
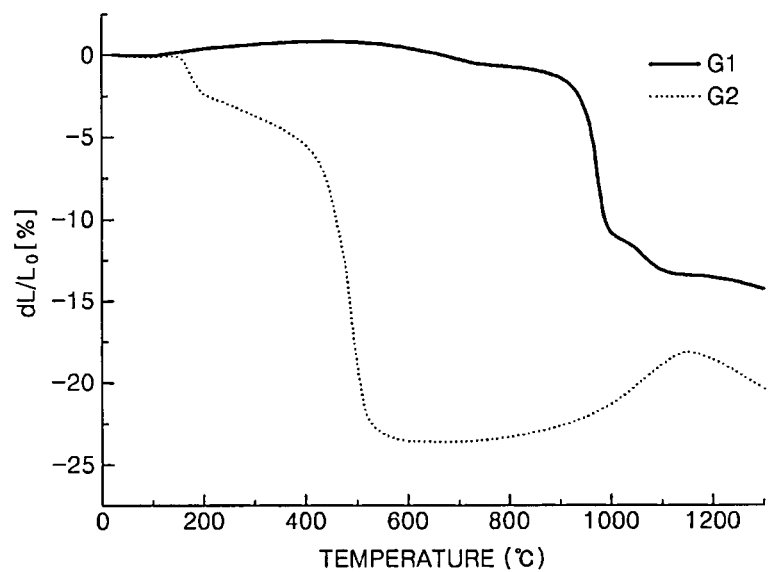

FIG. 6 shows the results of the fifth experimental example. In FIG. 6, a first curve G1 shows a result of the first molded body, and a second curve G2 shows a result of the second molded body. When comparing the first and second curves G1 and G2 of FIG. 6, the second molded body shows the contraction of particles at a temperature of about 400° C. However, in the first molded body, the contraction of particles starts at a temperature of about 1000° C.

Through the results of FIG. 6, the nano dots 20 coated with the graphene layer 14 may have a thermal stability that is improved compared to that of the nano dots 20 that are not coated with the graphene layer 14. In addition, where the nano dots 20 are coated with the graphene layer 14, the nano dots 20 contracted at a temperature of about 1000° C., which means that the post thermal treatment after forming the nano dots 20 as the trap layer uses a rapid thermal annealing (RTA) in the fabrication processes of the memory device. A charge trap type semiconductor memory device including the nano dots 20, which may be formed using the above-described method, as a trap layer will be described as follows.

Figure 7:
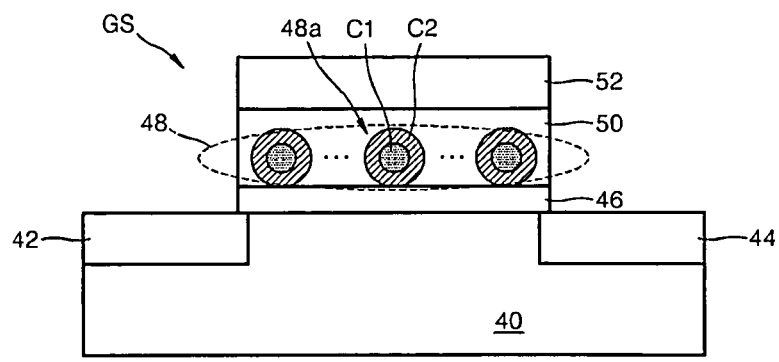

FIG. 7 is a cross-sectional view of the semiconductor memory device according to example embodiments. Referring to FIG. 7, a first impurity region 42 and a second impurity region 44 that are separated from each other may be formed in a substrate 40. One of the first and second impurity regions 42 and 44 is a source region, and the other is a drain region. A gate structure (GS) may be formed on the substrate 40 such that the GS may be between the first and second impurity regions 42 and 44. The gate structure GS may include a tunneling layer 46, a charge trap layer 48, a blocking layer 50, and a gate electrode 52 that may be sequentially stacked on the substrate 40. The tunneling layer 46 may be a silicon oxide layer, and the blocking layer 50 may be an oxide layer, for example, an aluminum oxide layer. The charge trap layer 48 may include a plurality of nano dots 48a as a single-layered structure or a multi-layered structure.

Each of the nano dots 48a may include a core C1 and a graphene layer C2 covering a surface of the core C1. The graphene layer C2 may be a type of nano dot. The graphene layer C2 may be a unit for preventing or reducing metal particles in the core C1 from diffusing, and at the same time, a charge-trapping unit. In addition, the graphene layer C2 may have an improved thermal resistance to that of the core C1. Therefore, the graphene layer C2 may prevent or reduce the nano dots 48a from adhering to each other in the post thermal treatment process. In addition, in the semiconductor memory device, the graphene layer C2 may prevent or reduce the nano dots from adhering to each other under increased temperature conditions, and thus, a reliability of the data may be maintained even in increased temperature conditions. The nano dots 48a may be formed using the above-described method of forming the nano dot. Thus, electric charges may be trapped by at least one of the graphene layer C2 and the core C1. The core C1 may be a nano dot that may be formed of one selected from the group consisting of Ni, Co, Fe, Pt, Au, Al, Cr, Cu, Mg, Mn, Mo, Rh, Si, Ta, Ti, W, U, V, and Zr.

Figure 8:
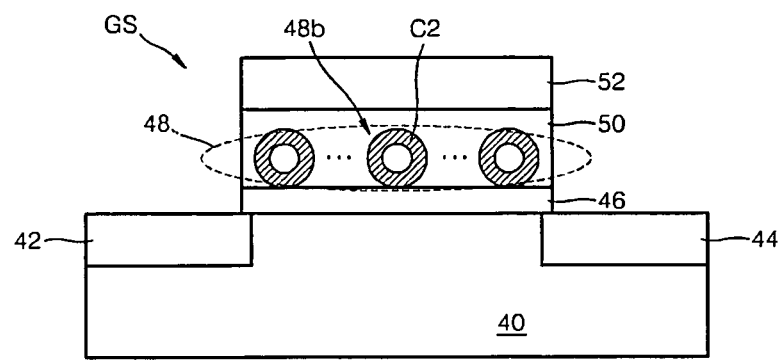

Also, because the graphene layer C2 may trap charges, the charge trap layer 48 may only include the graphene layer C2 or the graphene shell without the core C1, as illustrated in FIG. 8. FIG. 8 is a cross-sectional view showing the charge trap layer 48 of the semiconductor memory device shown in FIG. 7, the charge trap layer 48 may include the graphene layer (graphene shell) formed as a hollow sphere and including the graphene layers C2. In addition, the nano dots 48a may be formed on a two-dimensional plane, e.g., the tunneling layer 46, however, may be formed on a surface of a solid structure. For example, a trench may be formed on a portion where the nano dots 48a will be formed, and the nano dots 48a may fill the trench. In addition, the nano dots 48a may be arranged in a horizontal direction, however, the nano dots 48a may be arranged in a vertical direction. For example, the nano dots 48a may be used as a charge trap unit in a NAND type memory device. In addition, the graphene layer C2 may include a plurality of graphene sheets that may be sequentially stacked.

A method of fabricating the semiconductor memory device shown in FIG. 7 or FIG. 8 will be described with reference to FIGS. 9-15. FIGS. 9-15 are cross-sectional views illustrating the method of fabricating the semiconductor memory device of FIG. 7 or FIG. 8, according to example embodiments.

Figure 9:
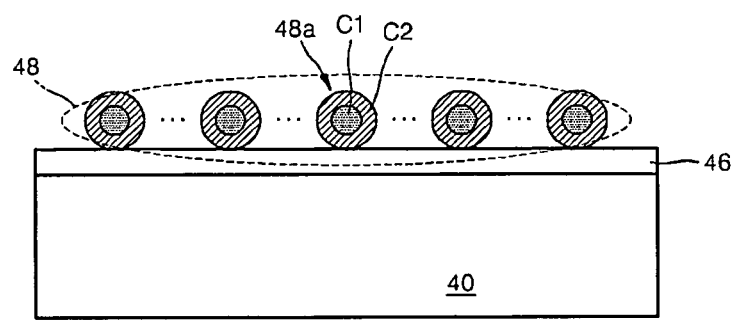

Referring to FIG. 9, the tunneling layer 46 may be formed on the substrate 40 of a silicon oxide layer. The tunneling layer 46 may be formed of another insulating layer as long as the insulating layer may perform the same function as that of the silicon oxide layer. The charge trap layer 48 may include the nano dots 48a formed on the tunneling layer 46, such that each of the nano dots 48a may include the core C1 and the graphene layer C2 coated on the surface of the core C1. The graphene layer C2 may be an example of various types of layers for nano dots. Therefore, other layers may be formed on the core C1 instead of the graphene layer C2. The charge trap layer 48 including the nano dots 48a may also be formed by additionally forming metal nano dots coated with the graphene layer C2 and coating the metal nano dots on the tunneling layer 46. Also, the metal nano dots may be coated with the graphene layer C2 by using a spin coating method or Langmuir-Bladgett (LB) method.

Figure 13:
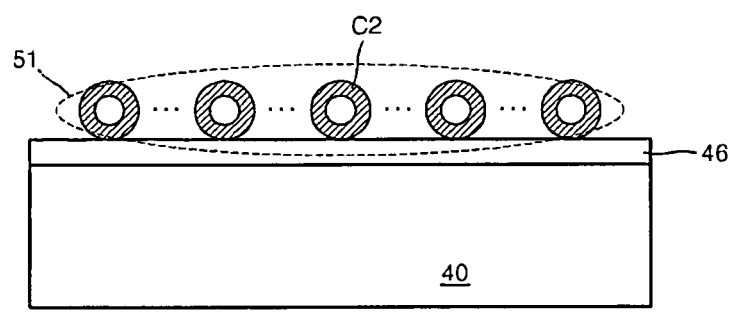

After forming the charge trap layer 48, the cores C1 of the nano dots 48a may be melted so as to be removed by using an acid solution, e.g., diluted HCl acid. Then, the charge trap layer 51, only including the graphene layers C2, may be formed on the tunneling layer 46 as shown in FIG. 13. In a case shown in FIG. 13, the charge trapping operation may be performed by the graphene layers C2. However, example embodiments are not limited thereto, and thus, the charge trap layer 48 may be formed using another method, according to example embodiments.

Figure 14:
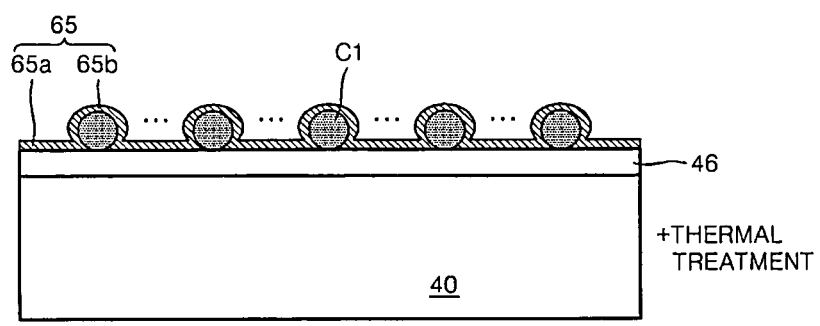

For example, as shown in FIG. 14, the cores C1, e.g., metal nano particles, which function as the graphitization catalyst and trap charges, may be coated on the tunneling layer 46. The metal nano particles may be examples as described above. The cores C1 may be formed separately, or may be coated on the tunneling layer 46 using the spin coating method or the LB method. A polymer 65 may be formed on the tunneling layer 46 to also cover the exposed surfaces of the cores C1. The polymer 65, applied on the cores C1 that function as the graphitization catalyst, may be a polymer having a structure and a composition including carbon. However, the density of the polymer 65 may be relatively high in order to form a dense graphene layer.

In a case where the polymer 65 is applied using the spin coating method or a dip coating method, the polymer 65 may be irregularly disposed and may have an irregular network structure of molecules, and thus, the dense structure of the polymer 65 may not be formed. However, if a self-assembly film may be formed on the graphitization catalyst by using the polymer 65, the polymer 65 may be regularly arranged in a direction perpendicular to the surface of the graphitization catalyst, and thus, the self-assembly film having an increased density may be formed, as shown in FIG. 16.

Figure 16:
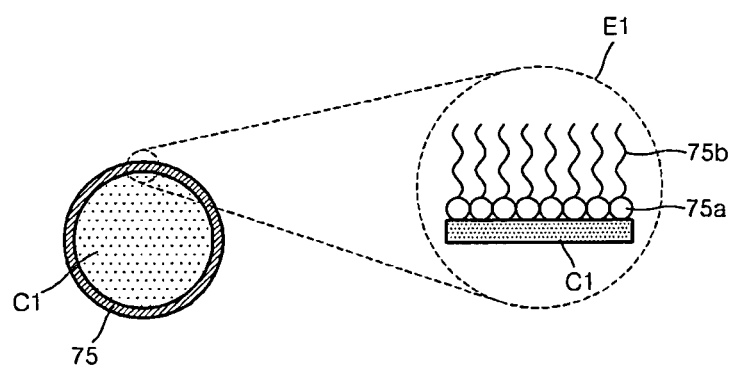

Referring to FIG. 16, the surfaces of one of the cores C1 having the function as the graphitization catalyst may be coated with a polymer 75. In the expanded portion E1 showing a part of the core C1 and the polymer 75, hydrophilic polymers 75a and hydrophobic polymers 75b may be sequentially connected to each other in a direction perpendicular to the surface of the core C1. Other hydrophobic polymers (not shown) may be connected to the hydrophobic polymers 75b, and other hydrophilic polymers (not shown) may be connected to the other hydrophobic polymers, and thus, the polymer connection structure may be repeated.

There are many kinds of polymers used to form the self assembly film in the direction perpendicular to the surface of the core C1 like the polymer 75 shown in FIG. 16. Such polymers may be arranged on the surface of the graphitization catalyst, e.g., the cores C1 using the LB method, the dip coating method, the spin coating method, or an evaporation method. A molecular weight of the polymers, a thickness of the polymers, or the number of self-assembly films may be adjusted according to the desired number of graphene layers.

Figure 15:
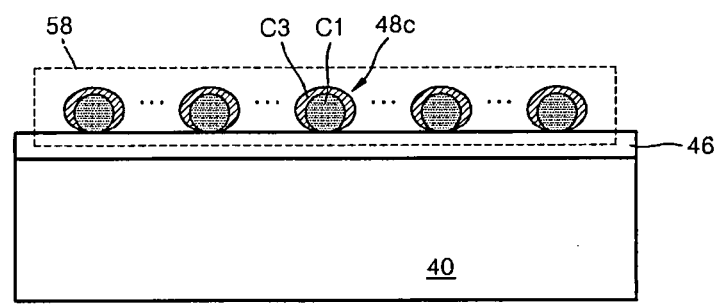

The description of the process shown in FIG. 14 will be continued as follows. After forming the polymer 65, the substrate 40 may be thermally treated at a predetermined or given temperature. Such thermal treatment may be performed in a furnace with an inert atmosphere or a reducing atmosphere. A thermal source for the thermal treatment may be radiant heat, laser, or infrared rays (IR). However, any kind of thermal source may be used as long as the thermal source may induce the graphitization of the polymer 65. The temperature of the thermal treatment may vary from about 400° C. to about 2000° C. or more according to the type of polymer. After performing the thermal treatment on the polymer 65, the polymer 65b, covering the surfaces of the cores C1, may become a graphene layer C3 due to the function of the cores C1 as a graphitization catalyst, as shown in FIG. 15, and the polymer 65a formed on the surface of the tunneling layer 46 may be thermally decomposed and removed from the surface of the tunneling layer 46. Accordingly, nano dots 48c, each of which may include the core C1 and the graphene layer C3 covering the exposed surface of the core C1, may be formed on the tunneling layer 46, as shown in FIG. 15, and the nano dots 48c form a charge trap layer 58.

From the result shown in FIG. 15, the cores C1 may be removed from the nano dots 48c using an acid solution, and thus, the charge trap layer 58 may only include the graphene layers C3. Processes after forming the charge trap layer 48 of FIG. 9 will be described as follows.

Figure 10:
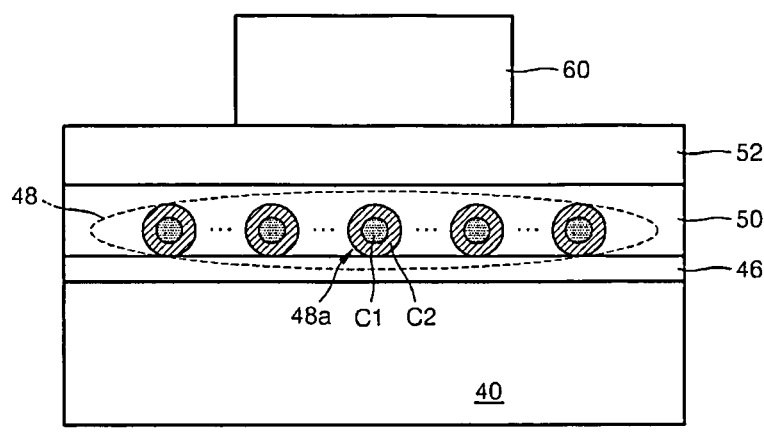

Referring to FIG. 10, the blocking layer 50 may be formed on the tunneling layer 46 to cover the charge trap layer 48. The blocking layer 50 may prevent or reduce the charges from moving to the gate electrode 52 during the charge trapping process. The blocking layer 50 may be formed of an oxide layer, for example, an aluminum oxide layer. The gate electrode 52 may be formed on the blocking layer 50. A mask 60 may be formed on the gate electrode 52 to define a gate area. The mask 60 may be a photosensitive layer pattern or a hard mask. The gate electrode 52, the blocking layer 50, the charge trap layer 48, and the tunneling layer 46, which is exposed around the periphery of the mask 60, may be sequentially etched until the substrate 40 may be exposed.

Figure 11:
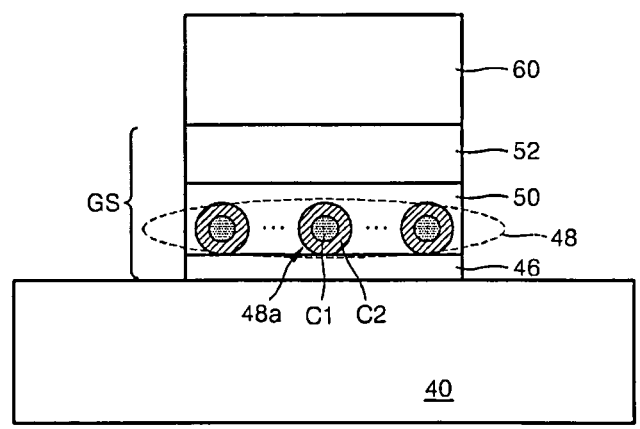
Figure 12:
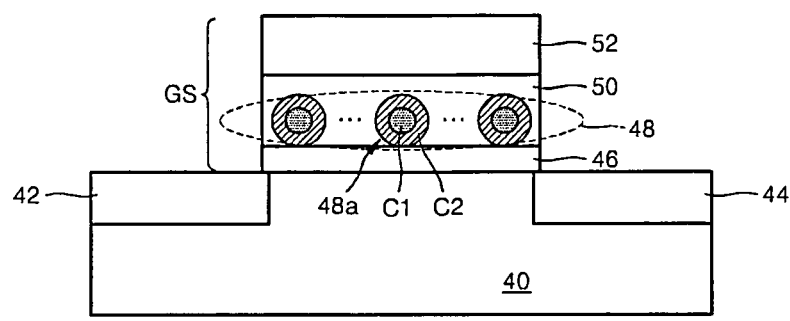

Through this etching process, the gate structure GS, including the gate electrode 52, the blocking layer 50, the charge trap layer 48, and the tunneling layer 46 remaining after the etching process, may be formed on a predetermined or given region of the substrate 40 as shown in FIG. 11. After performing the etching process, the mask 60 may be removed. As shown in FIG. 12, the mask 60 may be removed after forming the first and second impurity regions 42 and 44 in the substrate 40. Where the mask 60 is removed or not, an impurity of an opposite type to that of the impurity doped in the substrate 40 may be injected into the substrate 40 to form the first and second impurity regions 42 and 44. Thus, the first and second impurity regions 42 and 44 may be formed in the substrate 40 such that the gate structure GS may be interposed between the first and second impurity regions 42 and 44 as shown in FIG. 12.

Figure 17:
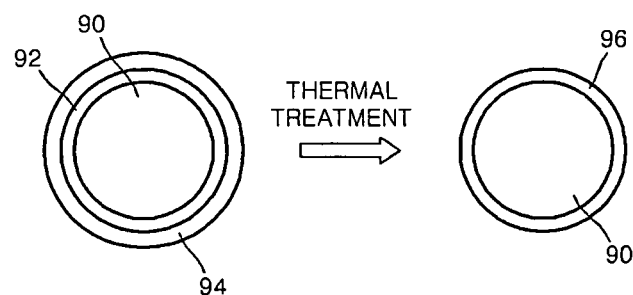

Also, where the cores C1 in the nano dots 48a of the charge trap layer 48 are metal nano particles 90 (hereinafter referred to as first metal particles 90) that trap charges and do not function as the graphitization catalyst, the charge trap layer 48 may be formed as shown in FIG. 17.

FIG. 17 is a diagram illustrating the graphene layer 48 formed of the first metal particles 90 that traps charges and do not function as the graphitization catalyst, according to example embodiments. Referring to FIG. 17, the surfaces of the first metal particles 90 may be coated with a material layer 92 functioning as the graphitization catalyst. After that, when the resultant of coating a polymer 94 on the first metal particles 90 are thermally treated, the surfaces of the first metal particles 90 may be coated with graphene layers 96 due to the reaction between the polymer 94 and the material layer 92.

The above-described examples do not limit the technical scope of the example embodiments. For example, one of ordinary skill in the art would configure a plurality of charge trap layers such that an insulating layer may be interposed between the charge trap layers. In addition, the charge trap layer may be formed in separate pieces in a horizontal direction. Also, another acid solution, apart from the HCl acid solution, may be used to obtain the graphene shell or layer.

While example embodiments have been particularly shown and described with reference to example embodiments thereof, it will be understood by one of ordinary skill in the art that various changes in form and details may be made therein without departing from the spirit and scope of the following claims.

What is claimed is:

1. A charge trap layer comprising nano dots including graphene layers, wherein each of the nano dots is a shell having an empty core.

2. The charge trap layer of claim 1, wherein the empty core of the nano dots are filled with a metal to trap charges.

3. The charge trap layer of claim 2, wherein the nano dots function as a graphitization catalyst.

4. The charge trap layer of claim 2, wherein the metal is one selected from the group consisting of Ni, Co, Fe, Pt, Au, Al, Cr, Cu, Mg, Mn, Mo, Rh, Si, Ta, Ti, W, U, V, and Zr.

5. The charge trap layer of claim 1, wherein each of the nano dots has a multi-layered structure.

6. The charge trap layer of claim 2, wherein each of the nano dots has a multi-layered structure.

7. The charge trap layer of claim 3, wherein each of the nano dots has a multi-layered structure.

8. A non-volatile memory device comprising:
a substrate including a first impurity region and a second impurity region located a distance apart from each other;
a tunneling layer on the substrate such that the tunneling layer is between the first and second impurity regions;
the charge trap layer of claim 1 on the tunneling layer, wherein the nano dots each have a trap site;
a blocking layer covering the charge trap layer; and
a gate electrode on the blocking layer.

* * * * *